(12) United States Patent
Scordino et al.

(10) Patent No.: US 8,585,247 B2
(45) Date of Patent: Nov. 19, 2013

(54) LIGHTING DEVICE

(75) Inventors: Alessandro Scordino, Mestre (IT);
Alessandro Brieda, Sacile (IT);
Giovanni Scilla, Fontane di Villorba (IT)

(73) Assignee: OSRAM Gesellschaft mit beschraenkter Haftung, Munich (DE)

( * ) Notice: Subject to any disclaimer, the term of this patent is extended or adjusted under 35 U.S.C. 154(b) by 686 days.

(21) Appl. No.: 12/129,058

(22) Filed: May 29, 2008

(65) Prior Publication Data
US 2009/0009996 A1  Jan. 8, 2009

(30) Foreign Application Priority Data

May 30, 2007 (EP) .................................. 07010691

(51) Int. Cl.
*F21V 29/00* (2006.01)
*B60Q 1/06* (2006.01)

(52) U.S. Cl.
USPC .......................................... 362/294; 362/373

(58) Field of Classification Search
USPC ................................................. 362/294, 373
See application file for complete search history.

(56) References Cited

U.S. PATENT DOCUMENTS

| | | | |
|---|---|---|---|
| 6,367,949 B1 | 4/2002 | Pederson | 362/240 |
| 6,428,189 B1 * | 8/2002 | Hochstein | 362/373 |
| 6,502,968 B1 * | 1/2003 | Simon | 362/489 |
| 6,582,100 B1 * | 6/2003 | Hochstein et al. | 362/294 |
| 6,999,318 B2 * | 2/2006 | Newby | 361/719 |
| 7,055,987 B2 * | 6/2006 | Staufert | 362/235 |
| 7,175,329 B1 * | 2/2007 | Chou | 362/612 |
| 7,207,693 B2 * | 4/2007 | Ratcliffe | 362/236 |
| 7,303,315 B2 * | 12/2007 | Ouderkirk et al. | 362/294 |
| 7,441,925 B2 * | 10/2008 | Chou et al. | 362/294 |
| 7,676,915 B2 * | 3/2010 | Ter-Hovhannissian | 29/840 |
| 7,705,365 B2 * | 4/2010 | Kurokawa et al. | 257/99 |
| 7,872,278 B2 * | 1/2011 | Stoyan | 257/99 |
| 2003/0179548 A1 | 9/2003 | Becker et al. | 361/704 |
| 2004/0222516 A1 | 11/2004 | Lin et al. | 257/712 |
| 2004/0264195 A1 * | 12/2004 | Chang et al. | 362/294 |
| 2005/0116235 A1 * | 6/2005 | Schultz et al. | 257/79 |
| 2006/0044806 A1 * | 3/2006 | Abramov et al. | 362/337 |
| 2006/0098441 A1 | 5/2006 | Chou | 362/294 |
| 2006/0181878 A1 * | 8/2006 | Burkholder | 362/294 |
| 2006/0262544 A1 * | 11/2006 | Piepgras et al. | 362/373 |
| 2007/0201232 A1 * | 8/2007 | Chen | 362/294 |
| 2009/0103296 A1 * | 4/2009 | Harbers et al. | 362/234 |

FOREIGN PATENT DOCUMENTS

WO  00/36336  6/2000

OTHER PUBLICATIONS

European Search Report; EP 07 01 0691; pp. 2, Nov. 7, 2007.

* cited by examiner

*Primary Examiner* — David J Makiya

(57) ABSTRACT

The lighting device has a stack of functional layers that in turn have at least: an optics layer with at least one optical element; a light source layer with at least one light source that is adapted to radiate light through the optics layer to an exterior; a printed circuit board connected to an electronic driver to drive the lighting device; and a cooling layer with at least one cooling element for cooling at least the at least one light source.

20 Claims, 4 Drawing Sheets

LIGHTING DEVICE

CROSS-REFERENCE TO RELATED APPLICATIONS

This application claims priority to European Patent Application Number 07010691.9 filed on May 30, 2007. The contents of this application is incorporated herein in its entirety by this reference.

TECHNICAL FIELD

The invention relates to a lighting device, and in particular to a lighting device using high power sources, especially LEDs.

BACKGROUND

Prior art lighting devices having high power LEDs use relatively bulky heat sinks to cool the LEDs which also makes the overall lighting devices bulky. Additionally, the relatively ineffective heat dissipation often affects the reliability of the system.

SUMMARY

A more compact and reliable lighting device, in particular for high power light sources like LEDs can be provided according to an embodiment by a lighting device, comprising a stack of functional layers, the functional layers comprising at least an optics layer comprising at least one optical element; a light source layer comprising at least one light source that is adapted to radiate light through the optics layer to an exterior; a printed circuit board comprising an electronic driver to drive the lighting device; and a cooling layer comprising at least one cooling element for cooling at least the at least one light source.

According to a further embodiment, the at least one light source may comprise an array of light emitting diodes. According to a further embodiment, the at least one light source may be attached to a primary optic. According to a further embodiment, the optical element can be a Fresnel structure. According to a further embodiment, the printed circuit board may comprise a flexible layer to connect to at least one of the other functional layers. According to a further embodiment, the printed circuit board may comprise a lower insulation layer. According to a further embodiment, the flexible layer may electrically connect the electronic driver to the at least one light source. According to a further embodiment, at least a portion of the flexible layer may be metallised. According to a further embodiment, the cooling layer may comprise a heat sink and a fan for cooling the heat sink. According to a further embodiment, the heat sink may comprise an array of heat conduction pins. According to a further embodiment, the fan can be mounted successively to the heatsink. According to a further embodiment, the heat sink can be made of at least 99% pure aluminium. According to a further embodiment, the at least one light source can be directly attached to the heat sink. According to a further embodiment, the printed circuit board can be directly mounted onto the heat sink.

BRIEF DESCRIPTION OF THE DRAWINGS

The lighting system will schematically be described in more detail in the following non-limiting and exemplary embodiment. Where applicable, the same reference numbers are used for identical or similar components.

DETAILED DESCRIPTION

The lighting device may comprise a stack of functional layers such that the device can be arranged in a compact manner. Because of the shorter connections and solid attachment, reliability is improved. The functional layers (or sections) may comprise at least (not necessarily in this order):

an optics layer comprising at least one optical element like a lens, a collimator etc., to shape light emitted from the light source layer;

a light source layer comprising at least one light source, e.g., a LED or a laser diode, that is adapted to radiate light through the optics layer to an exterior;

a printed circuit board comprising an electronic driver to drive/control the lighting device; and a cooling layer comprising at least one cooling element for cooling at least the light source(s).

The stack structure adds flexibility and design effectiveness because the layers may be independently customized or adjusted according to the system needs. Also, an excellent integration level is achieved.

Advantageously, the at least one light source may comprise an LED array.

Advantageously, a primary optics can be attached to the at least one light source, e.g., a lens attached on or after a light emitting face of the respective light source.

Advantageously, the optical element of the optics layer may comprise a Fresnel structure common to the light sources.

Advantageously, the printed circuit board may comprise a flexible layer to connect to at least one of the other functional layers. The flexible layer advantageously may at least connect the electronic driver to the at least one light source.

The printed circuit board may advantageously comprise a lower/base insulation layer. In an alternative embodiment, the insulation layer may not be integrated with the printed circuit board.

To maintain a cost effective and reliable electrical connection, at least portions of the flexible layers can be metallised.

To effectively cool at least the light source(s), the cooling layer may comprise a metal heat sink and a fan for cooling the heat sink, i.e., an active heat sink. Advantageously, the heat sink may comprise a bed of heat conduction/dissipation pins.

Advantageously, the heat sink can be made of more than 95% pure aluminium, preferably at least 99% pure aluminium, and can be advantageously made by high pressure molding, especially at a pressure above 800 bar, to improve thermal conductivity. The effective cooling enables a high brightness thanks to an increased thermal efficiency.

To effectively distribute heat away from the light sources, the at least one light source can be directly attached to the heat sink.

Figure 1:
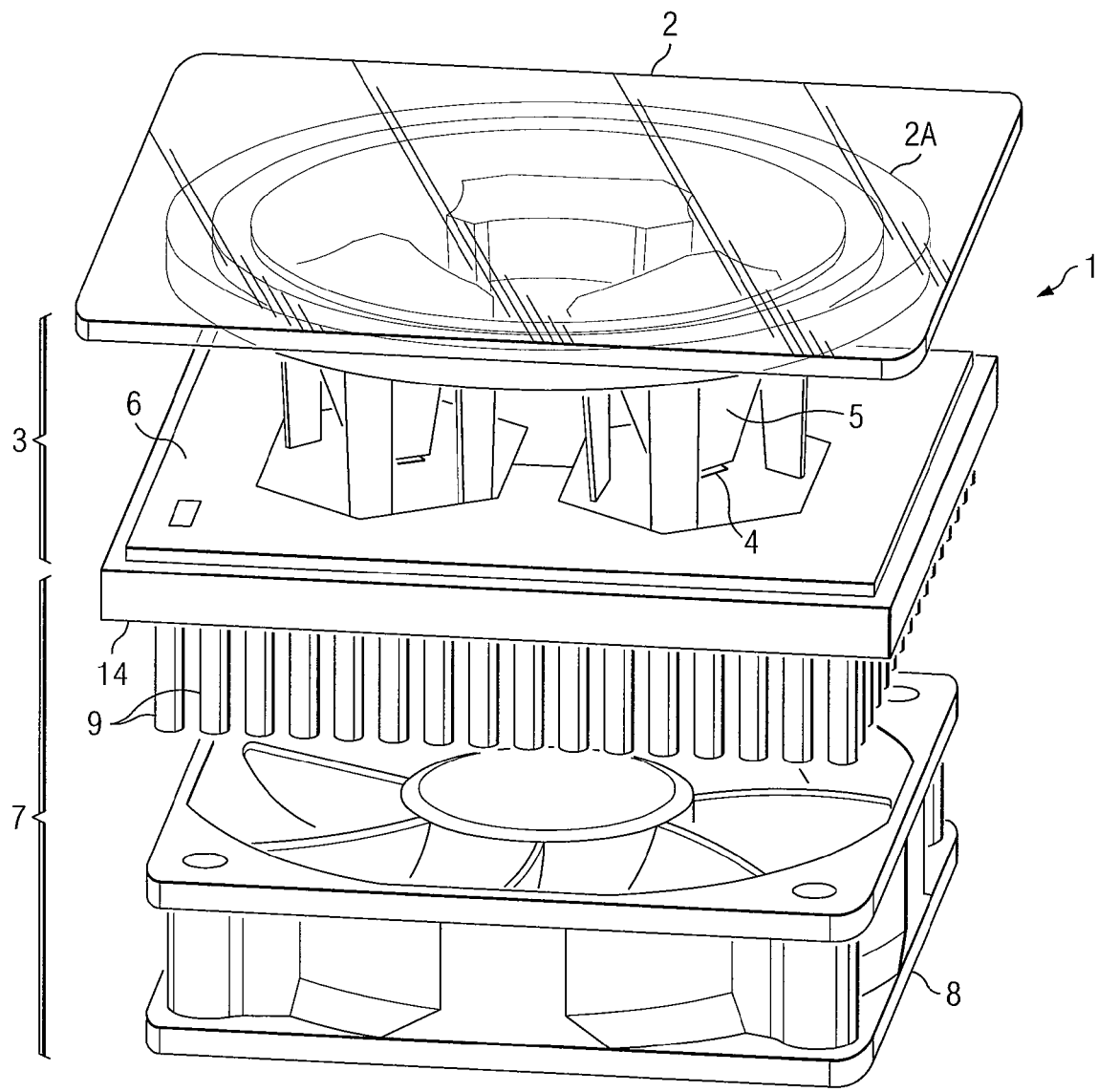
FIG. 1 shows a lighting device in a perspective view.

FIG. 1 shows a lighting device 1 without a housing for the sake of a better illustration. The lighting device comprises on top an optics layer 2 comprising a Fresnel structure. The optics layer 2 also functions as a protective front cover.

Below the optics layer 2 is arranged a light source layer 3 comprising three high power LEDs 4 that are covered by a primary optics including a respective collimator 5. Light emitted from the LEDs 4 is radiated through the respective primary optics/collimators 5 and then through the Fresnel structure of the optics layer 2 to the exterior. The Fresnel structure is common to all three LEDs. It comprises several Fresnel rings (2A) and a pillow structure (not shown) inside the rings 2A.

The lighting device 1 further comprises a printed circuit board 6 in turn comprising an electronic driver 20 to drive the lighting device 1, e.g., by controlling a LED current, or a fan speed (see below).

Further comprised is a cooling layer 7 in turn comprising a heat sink 17 (see FIG. 6) and a fan 8 for active cooling of the LEDs 4. The heat sink 17 in turn comprises an aluminium base plate 14 and a bed of heat-dissipating pins 9 on its bottom side. The fan 8 is shown spaced apart from the heat sink 17, as it is its position within the housing. The fan 8 and the heat sink 17 are arranged one after the other/successively (superimposed). As it will be explained in more detail further below, the PCB 6 and the LEDs 4 are both directly mounted on the heat sink.

This superimposed stacked arrangement achieves a very compact and reliable lighting device 1.

Figure 2:
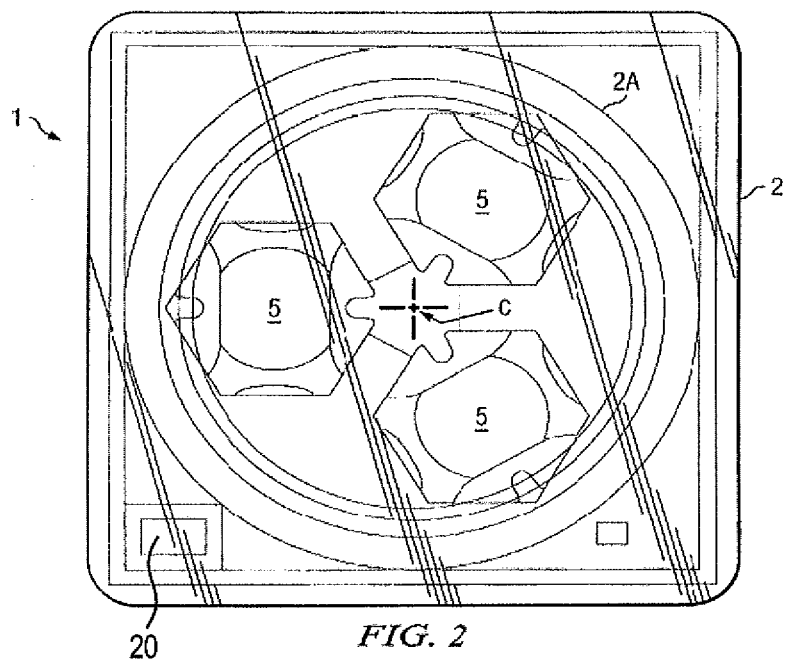
FIG. 2 shows the lighting device of FIG. 1 in a top-down view.

FIG. 2 shows the lighting device 1 of FIG. 1 in a top-down view. The transparent optics (and protection) layer 2 gives view on the collimators 5 of the light source layer 3. The collimators 5, and thus the LEDs, are arranged in an angular three-fold symmetry around a centre point C and are—in this view—optically placed within the Fresnel structure.

Figure 3:
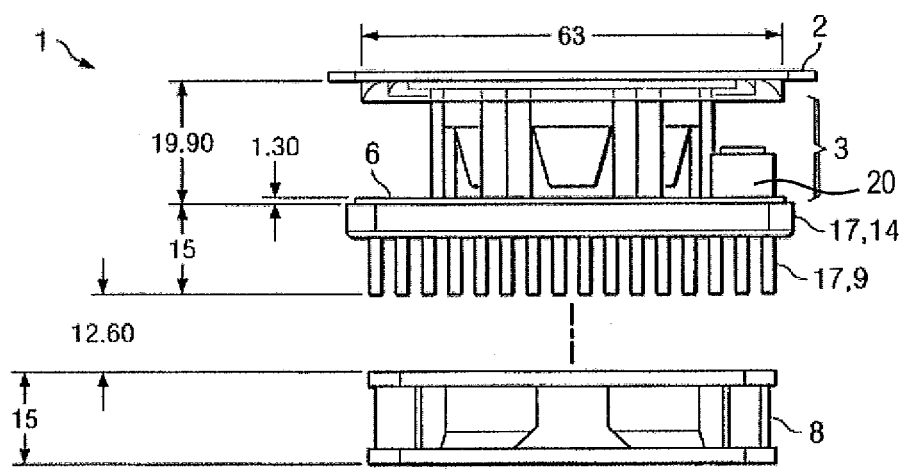
FIG. 3 shows the lighting device of FIG. 1 in a side view.

FIG. 3 shows the lighting device 1 of FIG. 1 in a side view including exemplary dimensions. The Fresnel lens is 63 mm wide; while the optics layer 2 is slightly wider for reasons of subsequent assembly. The light source layer 3 is 19.9 mm high, and the PCB 6 is 1.3 mm high. The heat sink 17 with its metal base plate 14 and heat dissipation pins 9 is 15 mm high and spaced apart 12.60 mm from the fan 8 of height 15 mm and width 60 mm.

Figure 4:
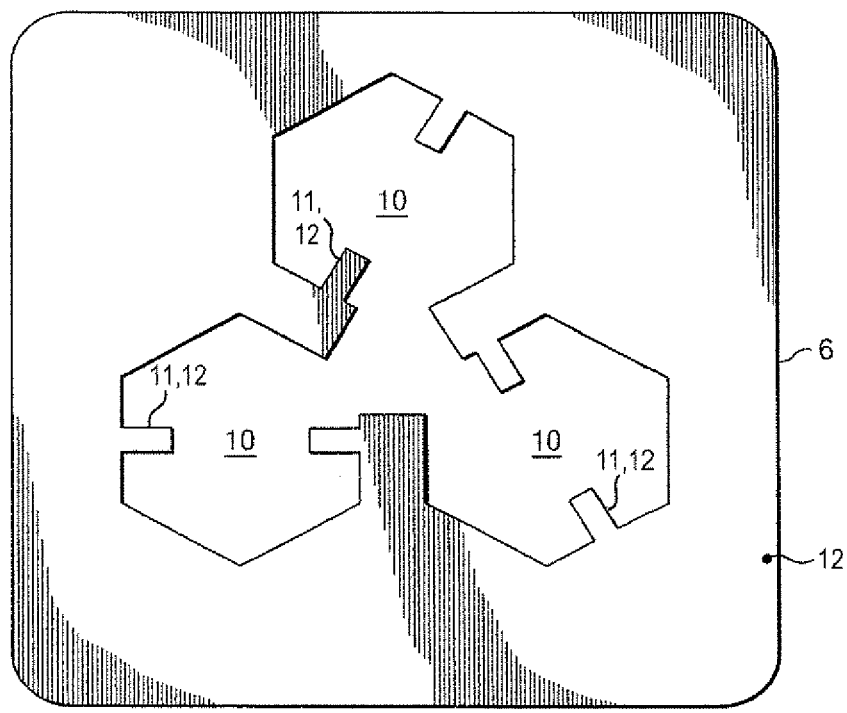
FIG. 4 shows a layout of the printed circuit board in a top-down view.

FIG. 4 shows a layout of the printed circuit board 6 in a top-down view. Because the LEDs 4 are arranged on the heat sink parallel to the PCB 6, the PCB 6 shows cut-outs 10 for receiving the LEDs 4. Flexible extensions 11 from the PCB 6 reach into the cut-outs 10.

Figure 5:
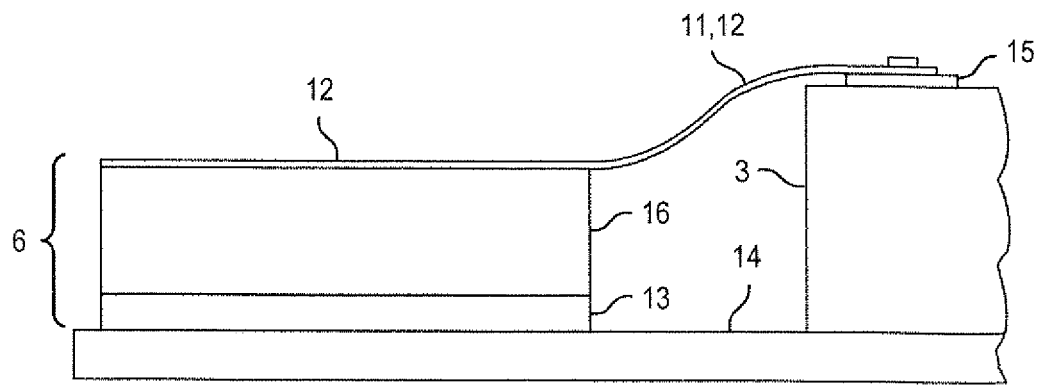
FIG. 5 shows a cut-out side view of the lighting system.

FIG. 5 shows a cut-out side view of the lighting system in the vicinity of the flexible extensions 11. The printed circuit board 6 has a multilayer structure with at least a flexible layer 12 that includes the flexible extensions 11 and an insulating layer 13 to insulate the upper layer(s) 12, 16 from a metal base plate 14 of a heat sink. The LEDs 4 are also placed directly on the base plate for improved heat transfer.

The extension 11 of the flexible layer 12 is at least on its lower side covered by a copper film to contact the PCB 6 with the LEDs 4. The electrical contact between the flexible extension 11 and a respective LED 4 are achieved by using a bonding pad 15 and a suitable connection technique, e.g., soldering. Thus an electrical connection can be created between the LED 4, via the bonding pad 15 and the flexible extension 11 and flexible layer 12 to the wiring layer 16 which in turn is connected to electric and/or electronic components like the integrated driver circuit 20.

The insulating layer 13 may be made from the same material as the PCB laminates. This provides a sufficient electrical insulation between metal traces (wiring) at the bottom side of the wiring layer and the heat sink 14.

In an alternative embodiment, the insulation layer may not be integrated in the printed circuit board.

This arrangement provides an easy to fabricate and reliable connection between the PCB 6 and other functional components 4. There are no other connection means needed. Because the shown design is susceptible to process automation of components and soldering, production and assembly costs can be reduced; this may be helped by the fact that multiple connections can made in the same step; i.e., that placing and soldering for all devices can be made at once. Also, for increased design flexibility, the PCB 6 can be placed on conductive surfaces thanks to its isolating bottom.

Figure 6:
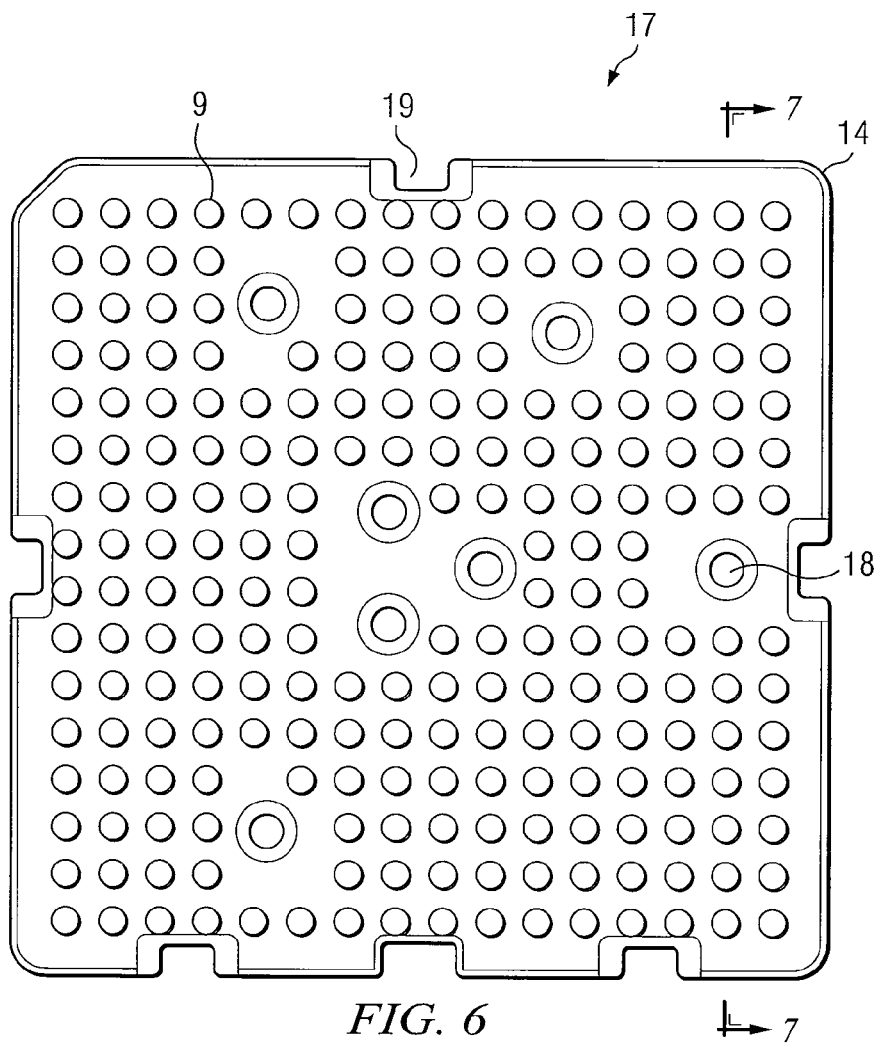
FIG. 6 shows a heat sink of the lighting device in a bottom-up view.

FIG. 6 shows a heat sink 17 of the lighting device in a bottom-up view. On the base plate 14 of the heat sink 17 is provided a bed made of the cylindrically shaped heat dissipation pins 9 in a substantially regular pattern. At some areas, pins are omitted to allow for through holes 18 to mount the heat sink 17, e.g. by screwing on. The base plate 14 also comprises recesses 19 at its periphery with a minimum radius of the outer contour of 0,5 mm.

The heat sink 17 is made of at least 99% pure aluminium, and has been fabricated by high pressure molding at a pressure above 800 bar to improve thermal conductivity. The effective cooling enables a high brightness thanks to an increased thermal efficiency.

Figure 7:
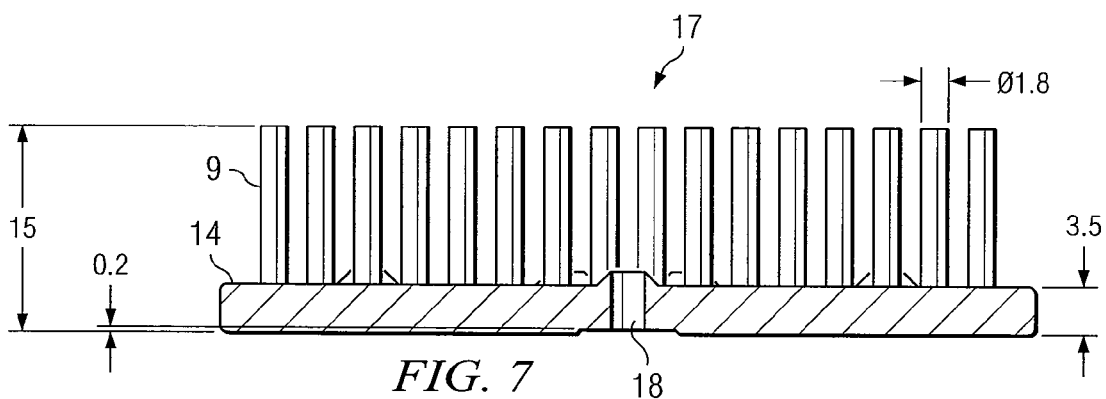
FIG. 7 shows the heat sink of FIG. 6 in a side view.

FIG. 7 shows the heat sink of FIG. 6 in a side view along the line A-A- of FIG. 6 with respective dimensions in mm.

LIST OF REFERENCE NUMBERS 1 lighting device
2 optics layer
2A Fresnel ring
3 light source layer
4 light source
5 collimator
6 printed circuit board
7 cooling layer
8 fan
9 heat dissipation pin
10 cut-out
11 flexible extensions
12 flexible layer
13 insulating layer
14 base plate
15 bonding pad
16 wiring layer
17 heat sink
18 through hole
19 recess
20 driver
C centre point

What is claimed is:

1. A lighting device, comprising a stack of functional layers, the functional layers comprising at least:
   an optics layer comprising at least one optical element;
   a light source layer comprising at least one light source that is adapted to radiate light through the optics layer to an exterior;
   a printed circuit board comprising an electronic driver to drive the lighting device; and
   a cooling layer comprising at least one cooling element for cooling at least the at least one light source,
   wherein the printed circuit board comprises at least one cut-out, the cut-out forming an opening and an extension,
   wherein the cut-out receives a respective light source, and wherein the printed circuit board comprises the extension which is a flexible layer, wherein the flexible layer is directly connected to the respective light source via a region of the flexible layer that extends into the at least one cut-out.

2. The lighting device according to claim 1, wherein the at least one light source is attached to a primary optic.

3. The lighting device according to claim 1, wherein the optical element is a Fresnel structure.

4. The lighting device according to claim 1, wherein the printed circuit board comprises a lower insulation layer.

5. The lighting device according to claim 1, wherein the cooling layer comprises a heat sink and a fan for cooling the heat sink.

6. The lighting device according to claim 5, wherein the heat sink comprises an array of heat conduction pins.

7. The lighting device according to claim 5, wherein the fan is mounted successively to the heat sink.

8. The lighting device according to claim 5, wherein the heat sink is made of at least 99% pure aluminium.

9. The lighting device according to claim 5, wherein the at least one light source is directly attached to the heat sink.

10. The lighting device according to claim 6, wherein the printed circuit board is directly mounted onto the heat sink.

11. The lighting device according to claim 1, wherein the printed circuit board comprises at least one cut-out for receiving a respective light source and wherein the at least one flexible extension reaches into a respective cut-out.

12. The lighting device according to claim 1, wherein at least a portion of the flexible layer is metalized such that the at least one flexible extension is covered by a copper film at least on its lower side.

13. The lighting device according to claim 1, wherein an electrical contact between the flexible extension and a respective light source is achieved by using a bonding pad.

14. The lighting device according to claim 1, wherein the printed circuit board comprises a multilayer structure that comprises a wiring layer, wherein the flexible layer is placed atop the wiring layer.

15. A lighting device, comprising:
at least one optical element;
at least one light source that is adapted to radiate light through an optics layer to an exterior;
a printed circuit board comprising an electronic driver to drive the lighting device;
and
at least one cooling element for cooling at least the at least one light source, wherein the optical element, the light source, the printed circuit board, and the cooling element are arranged in layers,
wherein the printed circuit board comprises at least one cut-out, the cut-out forming an opening and an extension,
wherein the cut-out receives a respective light source, and
wherein the printed circuit board comprises the extension which is a flexible layer, wherein the flexible layer is directly connected to the respective light source via a region of the flexible layer that extends into the at least one cut-out.

16. The lighting device according to claim 15, wherein the at least one light source comprises an array of light emitting diodes.

17. The lighting device according to claim 15, wherein the optical element is a Fresnel structure.

18. The lighting device according to claim 15, wherein the flexible layer connects to a wiring layer of the printed circuit board.

19. The lighting device according to claim 15, wherein the cooling layer comprises a heat sink and a fan for cooling the heat sink, wherein the fan is mounted successively to the heat sink.

20. The lighting device according to claim 19, wherein the heat sink comprises an array of heat conduction pins.

\* \* \* \* \*